(12) United States Patent
Takahashi (10) Patent No.: US 6,407,614 B1
(45) Date of Patent: Jun. 18, 2002

(54) SEMICONDUCTOR INTEGRATED SWITCHING CIRCUIT

(75) Inventor: Masaru Takahashi, Kamifukuoka (JP)

(73) Assignee: New Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 09/819,761

(22) Filed: Mar. 29, 2001

(30) Foreign Application Priority Data

Dec. 7, 2000 (JP) ........................................ 2000-372671

(51) Int. Cl.$^7$ .............................................. H03K 17/62
(52) U.S. Cl. ........................................ 327/415; 327/407
(58) Field of Search .................................. 327/407, 408, 327/415, 416

(56) References Cited

U.S. PATENT DOCUMENTS

| | | | | |
|---|---|---|---|---|
| 5,386,203 A | * | 1/1995 | Ishihara | ........................ 333/129 |
| 5,744,995 A | * | 4/1998 | Young | ........................ 327/407 |
| 5,768,691 A | * | 6/1998 | Matero et al. | ............... 333/101 |
| 6,040,718 A | * | 3/2000 | Henry | ........................ 327/407 |
| 6,115,585 A | * | 9/2000 | Matero et al. | ............... 333/101 |
| 6,185,434 B1 | * | 2/2001 | Hagstrom et al. | ........... 370/272 |

* cited by examiner

Primary Examiner—Jeffrey Zweizig
(74) Attorney, Agent, or Firm—Armstrong, Westerman & Hattori, LLP (57) ABSTRACT

The semiconductor integrated switching circuit S1 employed in a dual-band mobile phone comprises the first through fourth field effect transistor 1, 2, 3, 4 by which electrical connection between either of the first through fourth input/output terminal 22 through 25 and the common input-output terminal 21 are controlled, the fifth field effect transistor 5 which becomes conducting with the second field effect transistor 2, and the series resonance circuit 51 having a resonance frequency equals to a frequency of higher harmonic of the signal passing through the second field effect transistor 2. The fifth field effect transistor 5 and the series resonance circuit 51 are connected in series and attached between the common input-output terminal 21 and the ground so as to divert the higher harmonic of the signal without giving passing loss to the signal.

5 Claims, 6 Drawing Sheets

| $V_A$ | $V_B$ | $V_C$ | $V_D$ | PATH A-B | PATH A-C | PATH A-D | PATH A-E |
|---|---|---|---|---|---|---|---|
| TR1 ON | TR2 OFF | TR3 OFF | TR4 OFF | ON | OFF | OFF | OFF |
| TR1 OFF | TR2 ON | TR3 OFF | TR4 OFF | OFF | ON | OFF | OFF |
| TR1 OFF | TR2 OFF | TR3 ON | TR4 OFF | OFF | OFF | ON | OFF |
| TR1 OFF | TR2 OFF | TR3 OFF | TR4 ON | OFF | OFF | OFF | ON |

SEMICONDUCTOR INTEGRATED SWITCHING CIRCUIT

BACKGROUND OF THE INVENTION

The present invention relates to a semiconductor integrated switching circuit for switching input-output signal in high frequency circuit, more particularly, to the one for controlling and reducing higher harmonic component caused by non-linearity of the semiconductor integrated switching circuit.

Figure 5:
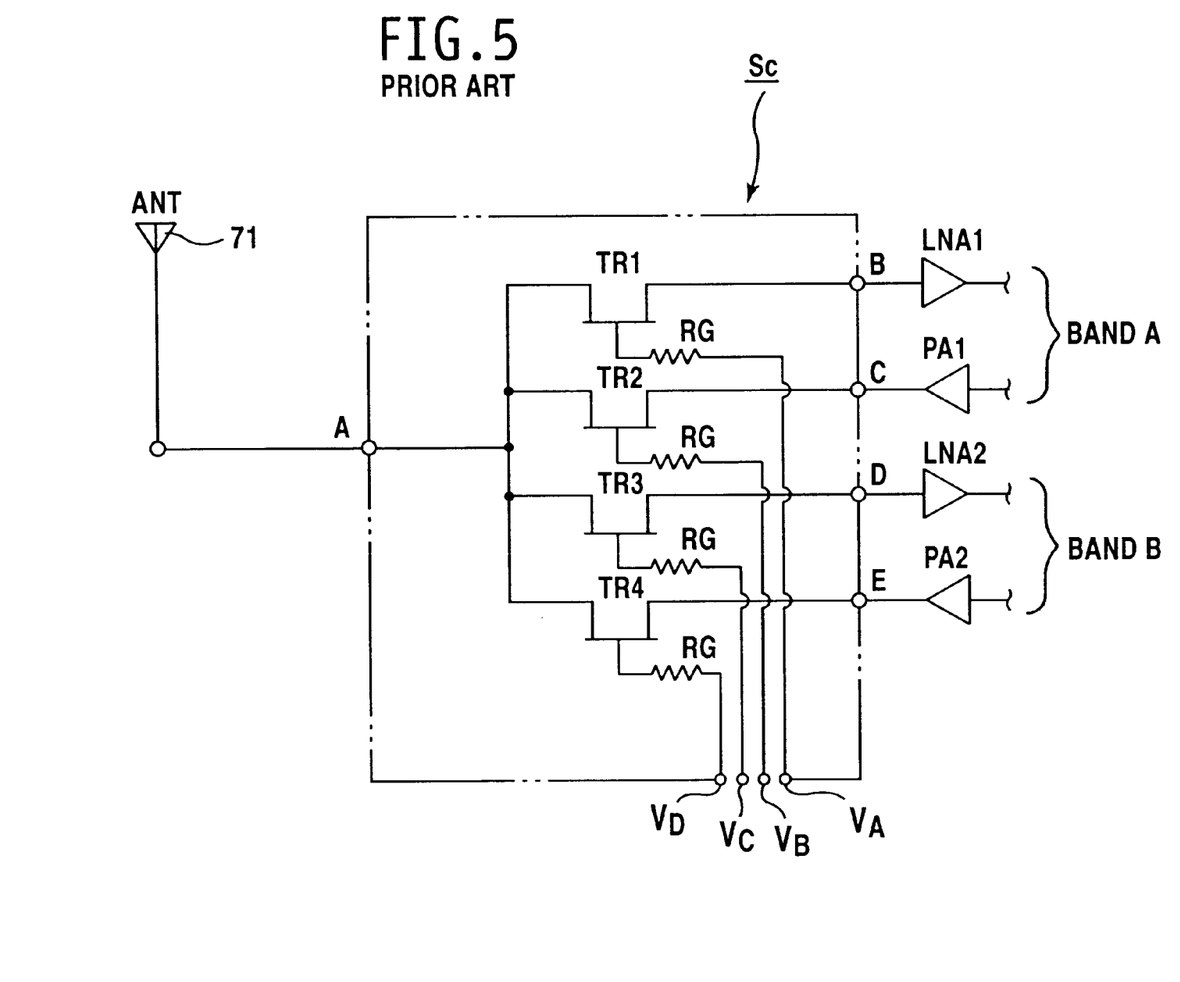
FIG. 5 is a circuit diagram showing a circuit of the prior art.

Conventionally, as this kind of circuit, for example, single pole 4 through switching circuit Sc employed in a dual-band mobile phone shown in FIG. 5 is well known.

The description of the circuit in the prior art will be given with referring to the FIG. 5. The single pole 4 trough switching circuit is configured as a semiconductor integrated circuit comprising four field effect transistors TR1, TR2, TR3, TR4 and attached between an antenna 71 and following high frequency circuits LNA1, PA1, LNA2, PA2 in a so-called dual-band mobile phone which can transmit and receive at two different radio frequencies.

In this term, LNA1 is a receiving front end for one band of two different frequencies, i.e. band A, PA1 is a transmitting amplification unit of band A, LNA2 is a receiving front end for the other band of two different frequencies, i.e. band B, PA2 is a transmitting amplification unit of band B.

Figure 6:
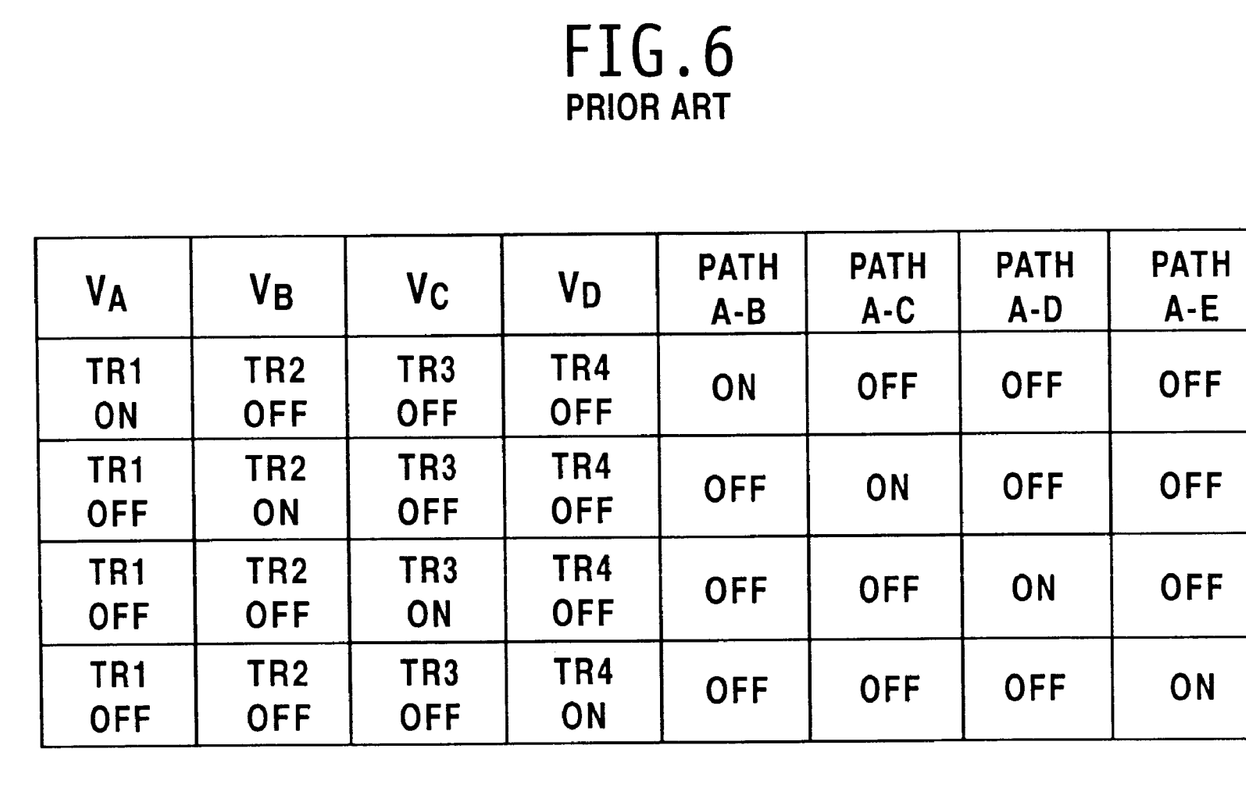
FIG. 6 is a diagram showing the operation of the semiconductor integrated switching circuit of the embodiment of the present invention and the conventional one.

In such configuration, in case of receiving of the band A, while control voltage VA is set to given value so as to make TR1 "on" state, control voltage VB, VC and VD are to be set to given values so as to keep TR2 to TR4 "off" state (Refer to FIG. 6). In case of keeping either of transistor TR2 trough TR4 "on" state, each "on"/"off" state of the transistor TR1 through TR4 shall be controlled by control voltage VA through VD.

In the conventional circuit, a nonlinear characteristic of the field effect transistor cause higher harmonics thereby the higher harmonics shall be output from the antenna 71 with the transmitting signal. However as for the electromagnetic wave from the antenna 71, there is a need to control the higher harmonic level to satisfy the demand due to the radio law for restricting the output level and the tolerance of unnecessary frequency components.

As a method for controlling the higher harmonic level, there is a method of attaching a band pass filter (BPF) of 2 bands between the single pole 4 through switching circuit Sc and the antenna 71.

However, there is a case where the frequency of band B is set to be even numbered multiple of band A, for example, 0.9 GHz and 1.8 GHz as two bands of the dual-band mobile phone. In such case, there is a problem the band pass filter (BPF) is useless because the second order harmonic of 0.9 GHz conforms to the band B of 1.8 GHz, thereby passes through the filter.

Moreover, even in the passing band of the filter, it may cause a loss in a passing signal, therefore while it may lowers the transmitting level at the transmission, and also deteriorates the receiving sensitivity due to the lower level of the receiving signal at the reception.

Furthermore, since the mobile phone is required to be downsized, it is very difficult to give room for adding a filter between the single pole 4 through switching circuit Sc and the antenna 71. Therefore, it is not practical to control and reduce higher harmonic with the filter.

SUMMARY OF THE INVENTION

The present invention is directed to solve said problem, and provide a semiconductor integrated switching circuit which controls the generation of unnecessary higher harmonic while reducing passing loss.

To attain the object of the invention, a semiconductor integrated switching circuit according to the present invention comprises a common input-output terminal, input/output terminals, switching elements for connecting terminals each of which interposed between the common input-output terminal and respective one of the input/output terminals, a ground terminal for grounding, a series resonance circuit having a resonance frequency set to be a higher harmonic of the fundamental frequency that passes trough one of the switching elements, and a switching element for the series resonance circuit. The series resonance circuit and the switching element for the series resonance circuit are connected in series and interposed between the common input-output terminal and the ground terminal. The control voltage applied to said one of the switching elements is commonly applied to the switching element for the series resonance circuit.

In the semiconductor integrated switching circuit having such configurations, a switching element for connecting terminals through which a signal including higher harmonic to be removed passes and a switching element for series resonance circuit are applied with same control voltage and turn on simultaneously. Therefore, the series resonance circuit is electrically connected between the common input-output terminal and the ground so that higher harmonic included in the signal is diverted into the ground through the series resonance circuit. That is, only the signal having same frequency as resonance frequency of the series resonance circuit is removed and other signal could pass through the switching element for connecting terminals without any influences of the series resonance circuit.

Accordingly, it becomes possible to provide a semiconductor integrated switching circuit in which the generation of unnecessary higher harmonic is prevented and the loss of passing signal is minimized.

DETAILED DESCRIPTION

The description of embodiments of the present invention will be given with referring to FIG. 1 through FIG. 4.

The present invention is not limited to elements, configurations and the like being described later, and various modifications are possible within the scope of the present invention.

In the following, description will be made according to the semiconductor integrated switching circuit of the present invention employed in so-called dual-band mobile phone as already described concerning with the conventional switching circuit.

Embodiment 1

The first embodiment of the present invention will be described with referring to FIG. 1.

The semiconductor integrated switching circuit S1 of the first embodiment is employed in a dual-band mobile phone and attached between a transmitting and receiving antenna 41 shared by two bands (noted as "ANT" in FIG. 1), a receiving front end 42 for the first band (band A) (noted as "LNA1" in FIG. 1), a transmitting amplification unit 43 for band A (noted as "PA1" in FIG. 1), a receiving front end 44 for the second band (band B) (noted as "LNA2" in FIG. 1) and a transmitting amplification unit 45 for band B (noted as "PA2" in FIG. 1), and thereby performs switching of transmitting and receiving signal of two bands as described later.

Figure 1:
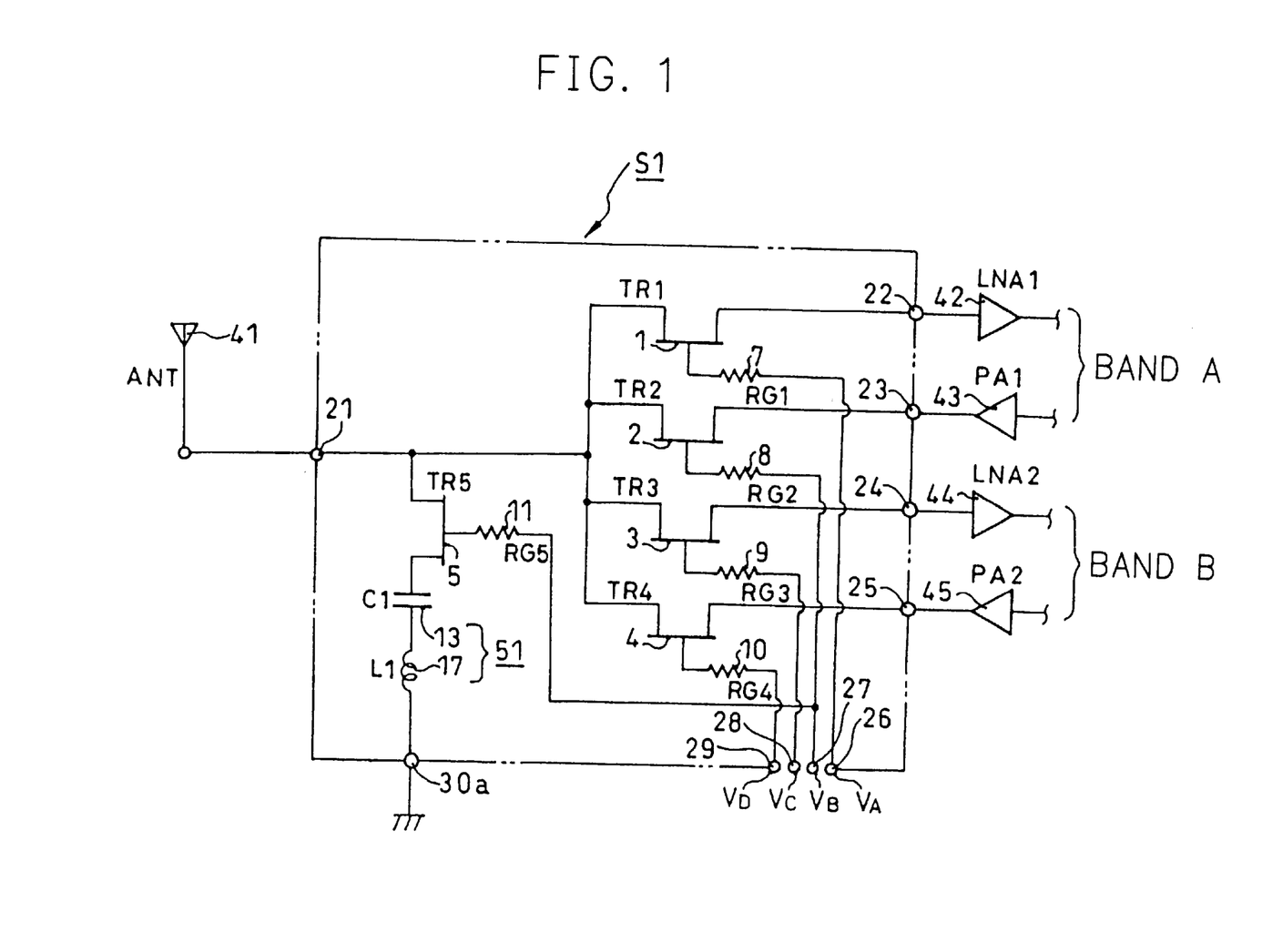
FIG. 1 is a circuit diagram showing a semiconductor integrated switching circuit according to the first embodiment of the present invention.

In the semiconductor integrated switching circuit S1, single pole 4 through switching circuit is mainly configured with the first through fifth field effect transistors 1, 2, 3, 4, 5 (noted as "TR1", "TR2", "TR3", "TR4" and "TR5" respectively in FIG. 1) and a series resonance circuit 51.

A drain (or source) of each field effect transistors 1, 2, 3, 4, 5 is commonly connected to a common input-output terminal 21 wherein the transmitting and receiving antenna 41 shared by two bands of dual-band mobile phone is also connected.

Further, a source (or drain) of the first field effect transistor 1 and the first input/output terminal 22, a source (or drain) of the second field effect transistor 2 and the second input/output terminal 23, a source (or drain) of the third field effect transistor 3 and the third input/output terminal 24, and a source (or drain) of the fourth field effect transistor 4 and the fourth input/output terminal 25 are connected respectively.

And the receiving front end 42 for band A and the first input/output terminal 22, the transmitting amplification unit 43 for band A and the second input/output terminal 23, the receiving front end 44 for band B and the third input/output terminal 24, and the transmitting amplification unit 45 for band B and the fourth input/output terminal 25 are connected respectively.

The receiving front end 42 for band A is a circuit performing amplification of received signal of band A, and the amplified signal is to be input to a following receiving circuit of band A (not shown). And the transmitting amplification unit 43 for band A is a circuit that performs final amplification of the signals to be transmitted. Further, the receiving front end 44 for band B is a circuit performing amplification of received signal of band B, and the amplified signal is to be input to a following receiving circuit of band B (not shown). And, the transmitting amplification unit 45 for band B is a circuit for performing the final amplification of the signals to be transmitted.

Further, it connects the gate of the first field effect transistor 1 with the first control terminal 26 via the first gate resistor (noted as "RG1" in FIG. 1), the gate of the second field effect transistor 2 with the second control terminal 27 via the second gate resistor (noted as "RG2" in FIG. 1), the gate of the third field effect transistor 3 with the third control terminal 28 via the third gate resistor (noted as "RG3" in FIG. 1), the gate of the fourth field effect transistor 4 with the fourth control terminal 29 via the fourth gate resistor (noted as "RG4" in FIG. 1) and the gate of the fifth field effect transistor 5 with the second control terminal 27 via the fifth gate resistor (noted as "RG5" in FIG. 1) respectively.

On the other hand, the series resonance circuit 51 is connected to the source (or the drain) side of the fifth field effect transistor 5. That is, the series resonance circuit 51, in which the first capacitor 13 (noted as "C1" in FIG. 1) and the first inductor 17 (noted as "L1" in FIG. 1) are connected serially, is connected between the source (or drain) of the fifth electric field transistor 5 and the ground terminal 30a.

Next, the operation of this embodiment will be described with referring to FIG. 1.

In case of receiving of band A, by an external control circuit (not shown), while the control voltage VA applied to the first control terminal 26 is set to be given voltage enables the first field effect transistor 1 set to be conducted, the control voltage VB, VC, VD applied to the second through the fourth control terminal 27, 28, 29 are set to be given voltage to keep the second through the fourth field effect transistor 2, 3, 4 "off" state.

Therefore, only the first field effect transistor 1 is in "on" state, i.e. the common input-output terminal 21 and the first input/output terminal 22 are electrically connected, and the second through the fourth field effect transistor 2, 3, 4 are in a "off" state, i.e. the common input-output terminal 21 and the second through the fourth input/output terminal 23, 24, 25 are not connected. Furthermore, the fifth field effect transistor 5 is also in a "off" state since the control voltage VB of the second control terminal 27 is impressed to its gate.

Consequently, a band A signal received with the transmitting and receiving antenna 41 shall pass through the first electric field transistor 1, and be input to the receiving front end 42 for band A, wherein the signal is amplified, and then input to the following receiving circuit for band A (not shown) for further processing of the signal such as decoding or the like, thereby reception of band A signal is completed.

On the other hand, in case of transmitting band A signal, while the control voltage VB, applied to the second control terminal 27 by the external control circuit (not shown), is to be given voltage enables the second field effect transistor 2 to be in "on" state, the control voltage VA, VC, VD, applied to the first, the third and the fourth control terminal 26, 28, 29 by the external control circuit, are to be given voltage enables the first, the third and the fourth field effect transistor 1, 3, 4 to be in "off" state. Further, the control voltage VB of the second control terminal 27 is impressed to the gate of the fifth field effect transistor 5.

Consequently, the second and fifth field effect transistor 2, 5 are to be in "on" state, i.e. the common input-output terminal 21 and the second input/output terminal 23 are electrically connected, and the first, third and fourth field effect transistor 1, 3, 4 are in "off" state, i.e. the common input-output terminal 21 and each of the first, third and fourth input/output terminal 22, 24, 25 are not connected, thereby the output signal from the transmitting amplification unit 43 for band A pass through the second field effect transistor 2.

On the other hand, the series resonance circuit 51 is to be conducted between the common input-output terminal 21 and the ground via the fifth field effect transistor 5 in "on" state. Therefore the higher harmonic component, having the same frequency as the resonance frequency of the series resonance circuit 51 and being included in the output signal delivered from the transmitting amplification unit 43 for band A through the second field effect transistor 2, is to be removed by conducting into the ground via the series resonance circuit 51, Thus the transmitting signal of band A in which given higher harmonic component is removed by the series resonance circuit 51 is to be impressed to the transmitting and receiving antenna 41.

That is, in a case where the second order harmonic of transmitting signal of band A is to be removed, each capacitance C1 and inductance L1 of the first capacitor 13 and the first inductor 17 of the series resonance circuit 51 is to meet the following equation 1. In the equation 1, fA represents the frequency of transmitting signal of band A (i.e. fundamental frequency).

$$2 \times fA = 1/\{2\pi(L1 \cdot C1)^{1/2}\} \qquad \text{Equation 1}$$

The higher harmonic component with frequency of 2×fA included in the transmitting signal is to be conducted to the ground due to that the series resonance circuit 51 resonates at a frequency of 2×fA. Therefore, since the common input-output terminal 21 is assumed to be grounded concerning with the signal of frequency 2×fA, a signal with the frequency 2×fA shall not to be radiated from the transmitting and receiving antenna 41.

With giving a specific example of a frequency, when a dual-band mobile phone having a band A with the frequency of 0.9 GHz and a band B with the frequency of 1.8 GHz is transmitting signal of band A, while the second order harmonic of band A signal shall not be radiated from the transmitting and receiving antenna 41 due to the series resonance circuit 51, the transmitting signal of 0.9 GHz frequency shall be radiated without a power loss owing to the series resonance circuit 51.

Furthermore, when a higher harmonic required to be removed by the series resonance circuit 51 is ordered at the number of "n" ("n" must be an integer of 2 or more), each value of C1 and L1 of the first capacitor 13 and the first inductor 17 is to meet the following equation 2.

$$n \times fA = 1/\{2\pi(L1 \cdot C1)^{1/2}\} \qquad \text{Equation 2}$$

That is, a resonance frequency of the series resonance circuit 51 should be set to that of a higher harmonic required to be removed, i.e., a higher harmonic ordered at the number of "n" of band A.

Next, in case of receiving the signal in band B, by means of the external control circuit (not shown), while the control voltage VC of the third control terminal 28 is set in a fixed value so as to keep the third field effect transistor 3 "on" state, the control voltage VA, VB, VD of the first, second and fourth control terminal 26, 27, 29 are set in a fixed value so as to keep the first, second and fourth field effect transistor 1, 2, 4 "off" state. The control voltage VB is impressed to the gate of the fifth field effect transistor 5 simultaneously.

Therefore, while only the third field effect transistor 3 is in "on" state, i.e. the common input-output terminal 21 and the third input/output terminal 24 are electrically connected, the first, second, fourth and fifth field effect transistor 1, 2, 4, 5 are in "off" state, i.e. the common input-output terminal 21 and each of the first, second and fourth input/output terminal 22, 23, 25 are not connected. Accordingly, band B signal received with the transmitting and receiving antenna 41 shall pass through the third electric field transistor 3, and be input to the receiving front end 44 for band B, wherein the signal is amplified, and then input to the following receiving circuit for band B (not shown) for further processing of the signal such as decoding or the like, thereby reception of band B signal is completed.

On the other hand, in case of transmitting band B signal, by means of the external control circuit (not shown), while the control voltage VD in the fourth control terminal 29 is to be given voltage enables the fourth field effect transistor 4 to be in "on" state, the control voltage VA, VB and VC of the first through third control terminal 26, 27, 28 are to be given voltage so as to keep the first trough third field effect transistor 1, 2, 3 "off" state, and the control voltage VB is impressed to the gate of the fifth field effect transistor 5. As a result, only the fourth field effect transistor 4 is in "on" state, i.e. the common input-output terminal 21 and the input/output terminal 25 are electrically connected, on the other hand, the first through third field effect transistor 1, 2, 3 are in "off" state respectively, i.e. the common input-output terminal 21 and the first through third input/output terminal 22, 23, 24 are not connected. An output signal transmitted from the transmitting amplification unit 45 for band B shall be radiated from the transmitting and receiving antenna 41 without being influenced by the series resonance circuit 51.

In addition, the relation of the control voltage VA, VB, VC, VD to "on"/"off" status in the first through fourth field effect transistor 1, 2, 3, 4, i.e. the relation of the control voltage VA, VB, VC, VD to electrical connection between the common input-output terminal 21 and the first through fourth input/output terminal 22, 23, 24, 25, in the semiconductor integrated switching circuit S1, is basically similar to that of the conventional circuit as shown in FIG. 6.

To apply FIG. 6 to the semiconductor integrated switching circuit according to the present invention, "path A-B" presents electrical connection between the common input-output terminal 21 and the first input/output terminal 22, "path A-C" presents that of between the common input-output terminal 21 and the second input/output terminal 23, "path A-D" presents that of between the common input-output terminal 21 and the third input/output terminal 24 and "path A-E" presents that of between the common input-output terminal 21 and the fourth input/output terminal 25, respectively.

Embodiment 2

Next, the second embodiment of the present invention will be described with referring to FIG. 2. Detailed description of components, which are shown in FIG. 1 with like reference numerals indicating like components throughout, shall be omitted with focusing on different points.

In a semiconductor integrated switching circuit S2 of the second embodiment, the second series resonance circuit 52 for expelling higher harmonic signal of transmitting frequency (fundamental frequency) of band B is attached in addition to the first series resonance circuit 51 for expelling higher harmonic signal of transmitting frequency of band A.

The semiconductor integrated switching circuit S2 comprises the sixth field effect transistor 6 in which drain (or source) is connected to the common input-output terminal 21, and the second series resonance circuit 52 which is attached on the source (or drain) side of the sixth field effect transistor 6.

Figure 2:
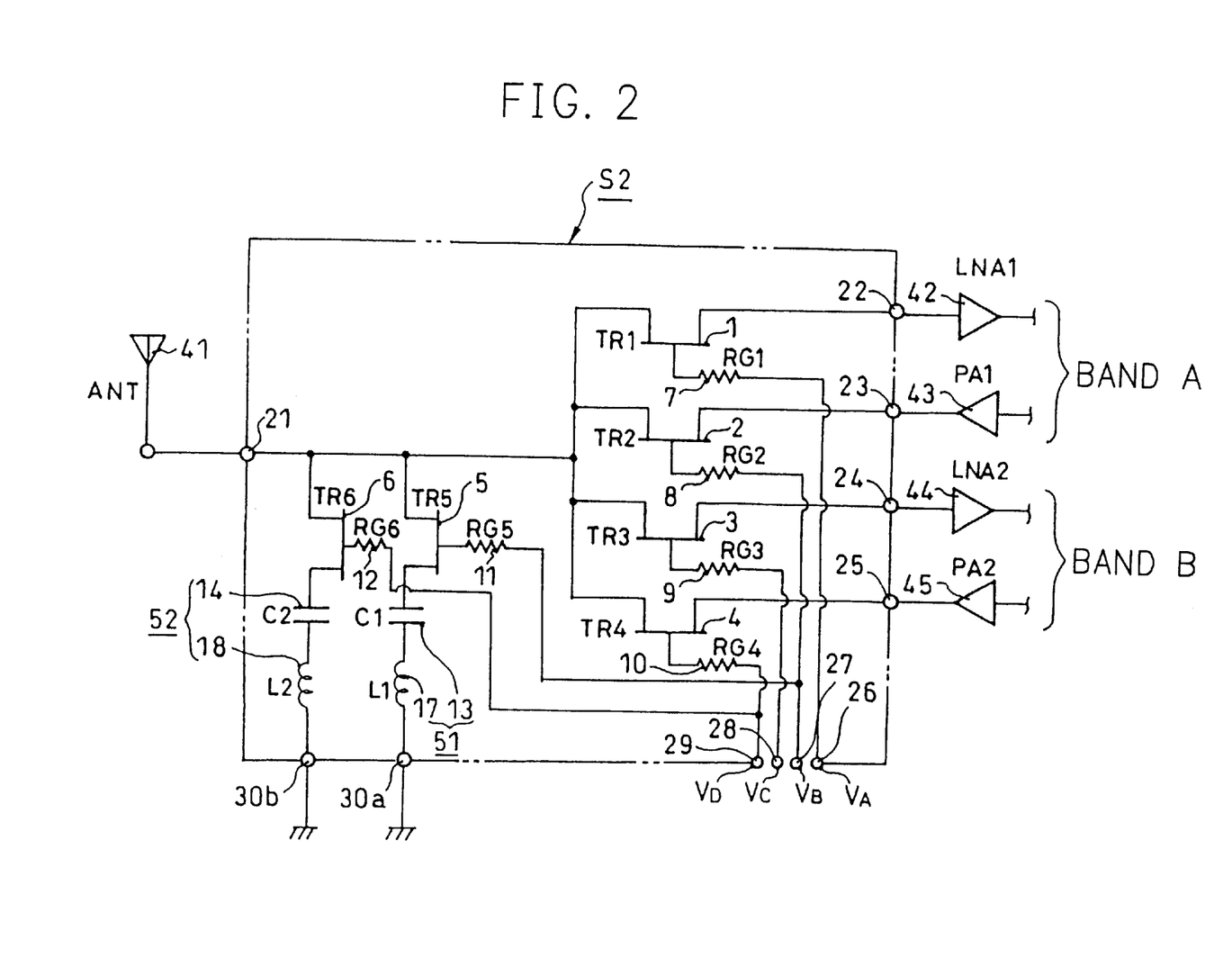
FIG. 2 is a circuit diagram showing a semiconductor integrated switching circuit according to the second embodiment of the present invention.

Further, the gate of the sixth field effect transistor 6 shall be connected to the fourth control terminal 29 via the sixth gate resistor 12 (noted as "RG6" in FIG. 2).

The second series resonance circuit 52, in which the second capacitor 14 (noted as "C2" in FIG. 2) and the second inductor 18 (noted as "L2" in FIG. 2) are connected serially, is connected between the source (or drain) of the sixth field effect transistor 6 and the ground terminal 30b.

And, the second series resonance circuit 52 wherein capacitance C2 of the second capacitor 14 and inductance L2 of the second inductor 18 shall meet the following equation 3 so as to make the resonance frequency matched to higher harmonics of band B ordered at the number of "n".

$$n \times fB = 1/\{2\pi(L2 \cdot C2)^{1/2}\} \qquad \text{Equation 3}$$

Here, fB is a frequency of the band B, and "n" is to be an integer of two or more.

Therefore, the semiconductor integrated switching circuit S2 wherein the first series resonance circuit 51 shall expel the prescribed higher harmonic component present in a transmitting signal of band A at the transmission of band A, and the second series resonance circuit 52 shall expel the prescribed higher harmonic component present in a transmitting signal of band B at the transmission of band B, another operations are similar to embodiment shown in FIG. 1.

Moreover, the second embodiment comprises the ground terminal 30a and 30b in accordance with the first and second series resonance circuit 51 and 52, but it is also possible to share one ground terminal.

Embodiment 3

Next, the description of the third embodiment will be described with referring to FIG. 3. Detailed description of components, which are shown in FIG. 1 or 2 with like reference numerals indicating like components throughout, shall be omitted with focusing on different points.

A semiconductor integrated switching circuit S3 of the third embodiment wherein two series resonance circuits are to be attached on the source (or drain) of the fifth and sixth field effect transistor 5 and 6 so as to expel two higher harmonic at band A and band B respectively.

That is, the first series resonance circuit 51 and the third series resonance circuit 53 are attached between the source (or the drain) of the fifth field effect transistor 5 and the ground, i.e., the first series resonance circuit 51 and the third series resonance circuit 53 are attached between the source (or the drain) of the fifth field effect transistor 5 and ground so that they are connected in parallel each other.

The first series resonance circuit 51 is previously shown in FIG. 1. The third series resonance circuit 53 comprises the third capacitor 15 (noted as "C3" in FIG. 3) and the third inductor 19 (noted as "L3" in FIG. 3). One end of the third capacitor 15 is connected to the source (or the drain) of the fifth field effect transistor 5, and another end is connected to one end of the third inductor 19. Another end of the third inductor 19 is grounded via the ground terminal 30c. The resonance frequency of the first series resonance circuit 51 is to be set to the higher harmonic of band A ordered at n1. The resonance frequency of the third series resonance circuit 53 is to be set to the higher harmonic of band A ordered at n3. That is, the following equation 4, 5 shall be satisfied.

$$n1 \times fA = 1/\{2\pi(L1 \cdot C1)^{1/2}\} \quad \text{Equation 4}$$

$$n3 \times fA = 1/\{2\pi(L3 \cdot C3)^{1/2}\} \quad \text{Equation 5}$$

Further, it is assumed that n1≠n3, and each of them must be an integer of two or more.

On the other hand, the second series resonance circuit 52 and the fourth series resonance circuit 54 are attached between the source (or the drain) of the sixth field effect transistor 6 and the ground, i.e., the second series resonance circuit 52 and the fourth series resonance circuit 54 are attached between the source (or the drain) of the sixth field effect transistor 6 and the ground so that they are connected in parallel each other.

The second series resonance circuit 52 is previously shown in FIG. 2. The fourth series resonance circuit 54 comprises the fourth capacitor 16 (noted as "C4" in FIG. 3) and the fourth inductor 20 (noted as "L4" in FIG. 3) which are connected serially. One end of the fourth capacitor 16 is connected to the source (or the drain) of the sixth field effect transistor 6, and another end is connected to one end of the fourth inductor 20. Another end of the fourth inductor 20 is grounded via the ground terminal 30d.

The resonance frequency of the second series resonance circuit 52 is to be set to the higher harmonic of band B ordered at n2. The resonance frequency of the fourth series resonance circuit 54 is to be set to the higher harmonic of band B ordered at n4.

That is, the following equation 6, 7 shall be satisfied.

$$n2 \times fB = 1/\{2\pi(L2 \cdot C2)^{1/2}\} \quad \text{Equation 6}$$

$$n4 \times fB = 1/\{2\pi(L4 \cdot C4)^{1/2}\} \quad \text{Equation 7}$$

Further, it is assumed that n2≠n4, and each of them must be an integer of two or more.

In case of transmitting of band A according to the present embodiment, the first and third series resonance circuit 51 and 53 are electrically connected between the common input-output terminal 21 and the ground respectively due to the "on" state of the second and fifth field effect transistor 2 and 5, thereby transmitting signal, in which the higher harmonics ordered at n1 and n3 are removed by the first and third series resonance circuit 51 and 53, is to be radiated from the transmitting and receiving antenna 41.

Further, in case of transmitting of band B, the second and fourth series resonance circuit 52 and 54 are electrically connected between the common input-output terminal 21 and the ground respectively because the fourth and sixth field effect transistor 4 and 6 are in "on" state, so transmitting signal, in which the higher harmonics ordered at n2 and n4 are removed by the second and fourth series resonance circuit 52 and 54, is to be radiated from the transmitting and receiving antenna 41.

Further, the operation at the reception of band A and B is similar to the embodiment shown in FIG. 1, therefore the detailed description is to be omitted here.

Although the third embodiment wherein the ground terminal 30a through 30d are attached corresponding with the first through fourth series resonance circuit 51 through 54, it is possible to be configured so as to share one ground terminal.

In addition, according to the third embodiment, the series resonance circuits are attached to remove higher harmonics respectively at both band A and band B. However, of course it is possible to be configured so as to perform the removal of higher harmonics only at either of them, e.g. at band of lower frequency, that is, only the first and third series resonance circuit 51 and 53 are attached to perform removal of higher harmonics of band A.

Embodiment 4

Next, the fourth embodiment of the present invention will be described with referring to FIG. 4. The detailed description of components, which is shown in FIG. 1 or 3 with like reference numerals indicating like components throughout, shall be omitted with focusing on different points.

In the semiconductor integrated switching circuit S4 of the fourth embodiment, the series resonance circuit comprises a passive circuit element within the semiconductor integrated switching circuit S4, and another passive circuit element which is attached to it exteriorly.

That is, the first capacitor 13 is connected between the source (or the drain) of fifth field effect transistor 5 and the outer parts connecting terminal 31a, as well as the third capacitor 15 is connected between the source (or the drain) of fifth field effect transistor 5 and the outer parts connecting terminal 31c.

In the outside of the semiconductor integrated switching circuit S4, the outer parts connecting terminal 31a and one terminal of the first inductor 17, and the outer parts connecting terminal 31c and one terminal of the third inductor 19 are connected respectively, on the other hand, both of another terminal of the first and third inductor 17 and 19 are grounded.

The first series resonance circuit 51 comprises the first capacitor 13 within the semiconductor integrated switching circuit S4 and the first inductor 17 attached to the outer parts connecting terminal 31a, and the third series resonance circuit 53 comprises the third capacitor 15 within the semiconductor integrated switching circuit S4 and the third inductor 19 attached to the outer parts connecting terminal 31c.

The second capacitor 14 is connected between the source (or the drain) of the sixth field effect transistor 6 and the outer parts connecting terminal 31b, and the fourth capacitor 16 is connected between the source (or the drain) of the sixth field effect transistor 6 and the outer parts connecting terminal 31d.

Further, the outside of the semiconductor integrated switching circuit S4 wherein the outer parts connecting terminal 31b and one terminal of the second inductor 18, and the outer parts connecting terminal 31d and one terminal of the fourth inductor 20 are connected respectively, on the other hand, both of another terminal of the second and fourth inductor 18 and 20 are grounded.

The second series resonance circuit 52 comprises the second capacitor 14 within the semiconductor integrated switching circuit S4 and the second inductor 18 attached to the outer parts connecting terminal 31b, and the fourth series resonance circuit 54 comprises the fourth capacitor 16 within the semiconductor integrated switching circuit S4 and the fourth inductor 20 attached to the outer parts connecting terminal 31d.

The reason why the element of the series resonance circuit, i.e. the inductor 17, 18, 19, 20, are attached outside the circuit S4 will be discussed as follows.

In a case where the semiconductor integrated switching circuit S4 is employed to a mobile phone, the configuration of this embodiment wherein a inductance coil (inductor 17,18,19,20 in this embodiment) is attached to outer parts connecting terminal can be said to be against for the demand for downsized mobile phone because it requires to make space for attaching the inductance coil.

On the other hand, a semiconductor integrated circuit for high frequency signal, so-called a microwave monolithic IC, demands a high electron mobility and employs special semiconductor material such as GaAs, thereby the unit price is more expensive than typical semiconductor integrated circuit.

Therefore, if the inductance coil is formed monolithically in the semiconductor integrated switching circuit S4 configured as a microwave monolithic IC, it shall be formed spiral inductance which occupies a large area. Accordingly the unit price of the IC rises, and it is impossible to provide the device at a reasonable cost.

The fourth embodiment is one of measures directed to provide the product at a reasonable cost with considering said problem.

Figure 3:
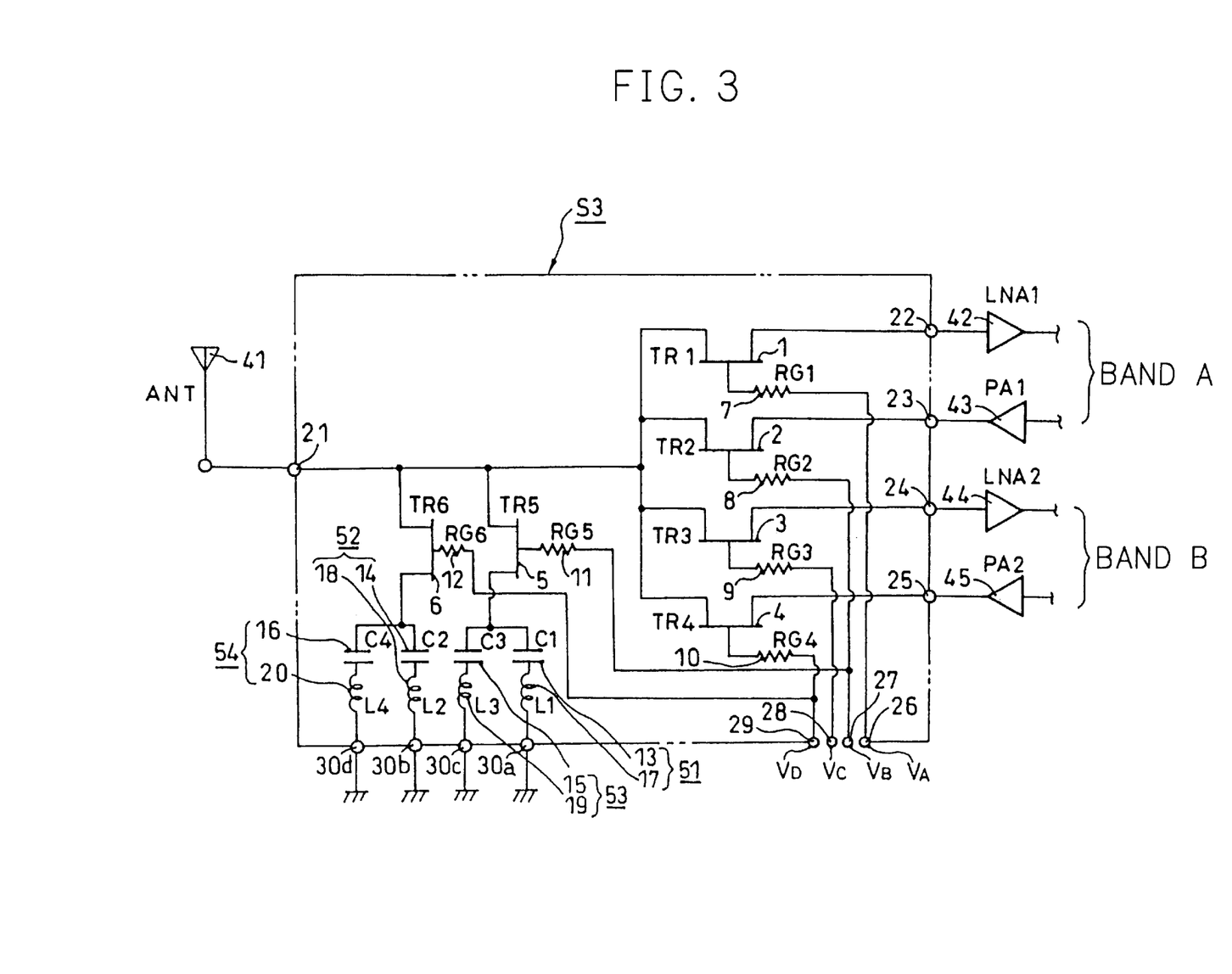
FIG. 3 is a circuit diagram showing a semiconductor integrated switching circuit according to the third embodiment of the present invention.
Figure 4:
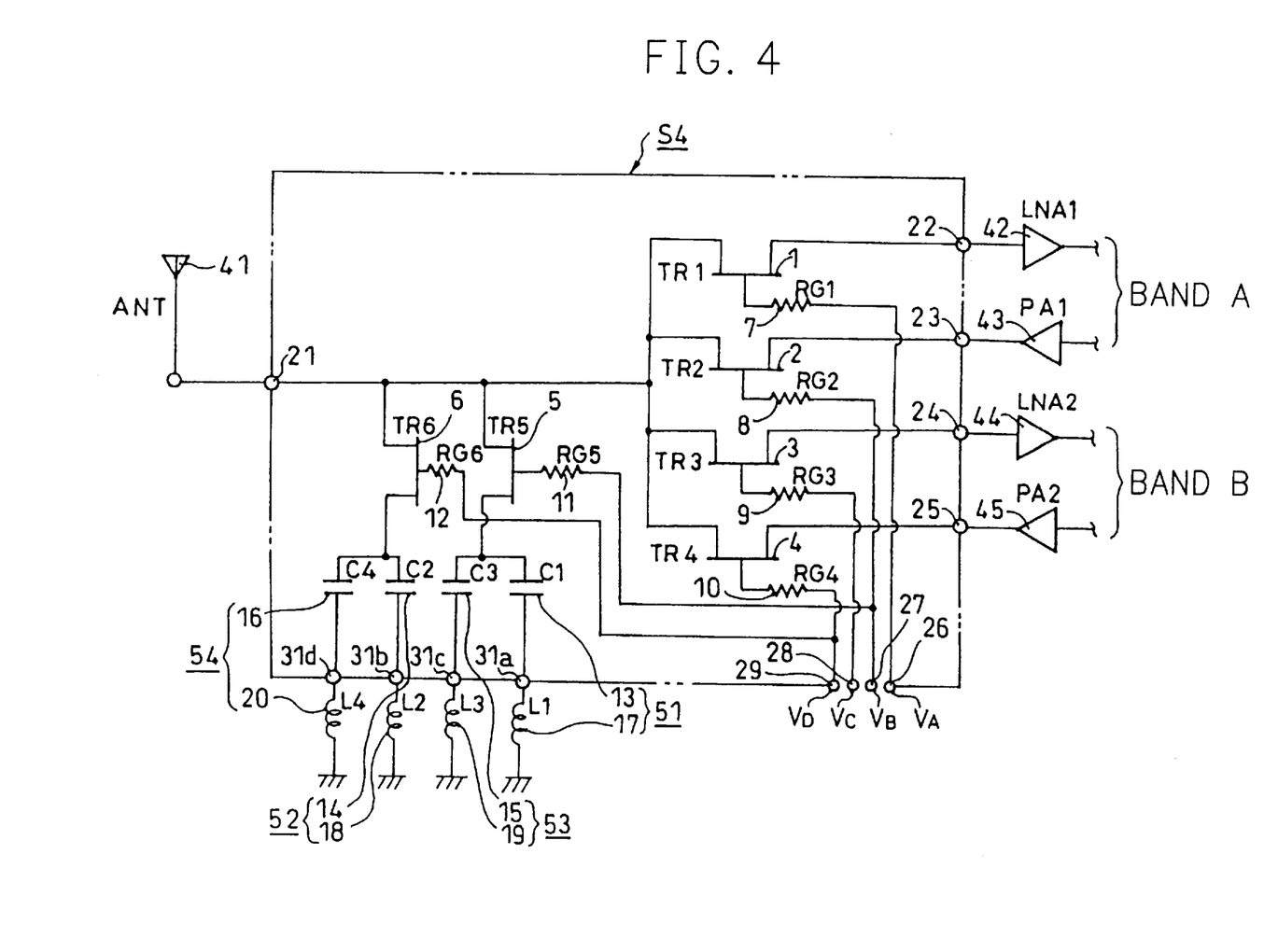
FIG. 4 is a circuit diagram showing a semiconductor integrated switching circuit according to the -fourth embodiment of the present invention.

The basic operation of the embodiment is similar to the embodiment shown in FIG. 3.

That is, the first and third series resonance circuit 51 and 53 are electrically connected between the common input-output terminal 21 and the ground respectively due to the "on" state of the second and fifth field effect transistor 2 and 5 at the transmission of band A, thereby transmitting signal, in which the higher harmonics ordered at n1 and n3 are removed by the first and third series resonance circuit 51 and 53, are to be radiated from the transmitting and receiving antenna 41.

Further, the second and fourth series resonance circuit 52 and 54 are electrically connected between the common input-output terminal 21 and the ground respectively due to the "on" state of the fourth and sixth field effect transistor 4 and 6 at the transmission of band B, thereby transmitting signal, in which the higher harmonics ordered at n2 and n4 are removed by the second and fourth series resonance circuit 52 and 54, are to be radiated from the transmitting and receiving antenna 41.

In addition, the operation of the reception of both band A and band B are similar to that of the embodiment shown in FIG. 1, therefore the detailed description will be omitted.

According to the fourth embodiment, the series resonance circuits are attached to remove higher harmonics respectively at both of band A and band B. However, of course it is possible to be configured so as to perform the removal of higher harmonics only at either of them, e.g. at band of low frequency, that is, only the first and third series resonance circuit 51 and 53 are attached to perform removal at of higher harmonics of band A.

In the embodiments described above, the semiconductor integrated switching circuit S1 to S4 each of them comprising so-called single pole 4 through switching circuit are explained. However, the scope of the present invention is not limited to the embodiments mentioned above, and the semiconductor integrated switching circuit according to the present invention is also applicable to the single pole 4 through switching circuit ("n" is an integer of two or more).

In the semiconductor integrated switching circuit according to the present invention, only the higher harmonic component of the signal is diverted to the ground while maintaining the path of desired signal, thereby enable to control radiation of higher harmonics and minimize the loss of desired signal.

Especially, the series resonance circuit for removing higher harmonic is to be electrically connected between the common input-output terminal and the ground only when the signal, for which the series resonance circuit is assigned, passes through between the common input-output terminal and the input/output terminal. Therefore, even in the dual-band circuit wherein one signal frequency is multiple against the other, it is possible to prevent the series resonance circuit for removing higher harmonic accompanying with the one frequency from causing loss of passing signal of the other frequency, and to remove higher harmonic and unnecessary frequency without attaching the higher harmonic removal filter separately to the outside of the circuit as the conventional way.

What is claimed is:

1. A semiconductor integrated switching circuit for connecting a common input-output terminal selectively to any one of input/output terminals comprising, switching elements for selectively connecting terminals, each of which interposed between the common input-output terminal and respective one of the input/output terminals, and controlled by a control voltage applied externally;

a ground terminal for grounding;

a series resonance circuit having a resonance frequency set to be a higher harmonic of the fundamental frequency that passes trough one of the switching elements;

and a switching element for the series resonance circuit, wherein the series resonance circuit and the switching element for the series resonance circuit are connected in series and interposed between the common input-output terminal and the ground terminal, and the control voltage applied to said one of the switching elements is commonly applied to the switching element for the series resonance circuit.

2. The semiconductor integrated switching circuit of claim 1, wherein plurality of series resonance circuits each of which is connected to respective switching element for series resonance circuit in series and interposed between the common input-output terminal and the ground terminal.

3. The semiconductor integrated switching circuit of claim 1, wherein series resonance circuits having different resonance frequencies are connected in parallel each other and interposed between the switching element for series resonance circuit and the ground terminal.

4. The semiconductor integrated switching circuit of claim 1, wherein each of said switching elements for selectively connecting terminals is field effect transistor, either a drain or source thereof is connected to said common input-output terminal and the other is connected to respective one of said input/output terminals, and said control voltage is applied to its gate via a gate resistor, and said switching element for series resonance circuit is a field effect transistor, either a drain or source thereof is connected to said common input-output terminal and the other is connected to said ground terminal, and said control voltage is applied to its gate via a gate resistor.

5. The semiconductor integrated switching circuit of claim 1, wherein the series resonance circuit comprises a capacitor and an inductor which are connected in series, the capacitor is attached between the switching element for series resonance circuit and the ground terminal, and the inductor is attached externally between the ground terminal and the ground so that the ground terminal is grounded through the inductor.

* * * * *